(12) United States Patent
Shi et al.

(10) Patent No.: US 6,680,863 B1
(45) Date of Patent: Jan. 20, 2004

(54) MRAM MEMORY ARRAY HAVING MERGED WORD LINES

(75) Inventors: Xizeng Shi, Fremont, CA (US); Qiuqun Qi, Fremont, CA (US)

(73) Assignee: Western Digital (Fremont), Inc., Fremont, CA (US)

( * ) Notice: Subject to any disclaimer, the term of this patent is extended or adjusted under 35 U.S.C. 154(b) by 0 days.

(21) Appl. No.: 10/192,276

(22) Filed: Jul. 9, 2002

(51) Int. Cl.[7] ............................ G11C 11/14; G11C 11/15
(52) U.S. Cl. ................................. 365/171; 365/173
(58) Field of Search .................................. 365/171, 173

(56) References Cited

U.S. PATENT DOCUMENTS

| | | | |
|---|---|---|---|
| 6,174,737 B1 | 1/2001 | Durlam et al. ............... 365/171 |
| 6,359,805 B1 * | 3/2002 | Hidaka ........................ 365/171 |
| 6,396,735 B2 * | 5/2002 | Michijima et al. ........... 365/171 |
| 6,445,613 B1 * | 9/2002 | Nagai .......................... 365/171 |

* cited by examiner

*Primary Examiner*—Trong Phan
(74) *Attorney, Agent, or Firm*—Sawyer Law Group LLP

(57) ABSTRACT

A method and system for providing and using a magnetic memory including magnetic memory cells is disclosed. The method and system include providing a magnetic tunneling junction including a first ferromagnetic layer, a second ferromagnetic layer and an insulating layer between the first ferromagnetic layer and the second ferromagnetic layer. The magnetic memory cell is coupled to a merged word line and a bit line. The merged word line selects the magnetic memory cell during a reading and carries a write current for the magnetic memory cell during writing. The bit line provides current to the magnetic memory cell during the reading and the writing. The currents provided by the bit line and the merged word line during writing allow data to be written to the magnetic memory cell.

12 Claims, 5 Drawing Sheets

MRAM MEMORY ARRAY HAVING MERGED WORD LINES

FIELD OF THE INVENTION

The present invention relates to magnetic memory systems, and more particularly to a method and system for providing a magnetic memory and a read/write scheme for utilizing the magnetic memory.

BACKGROUND OF THE INVENTION

Magnetic memories are often used in storing data. One type of memory currently of interest utilizes magnetic tunneling junctions in the memory cells. A magnetic tunneling junction typically includes two ferromagnetic layers separated by a thin insulating layer. The insulating layer is thin enough to allow charge carriers to tunnel between the ferromagnetic layers. The resistance of the magnetic tunneling junction depends upon the orientation of the magnetic tunneling junctions.

FIG. 1 depicts a conventional magnetic memory cell 10 as used in a conventional magnetic memory. The conventional memory cell 10 is coupled with a bit line 20 and receives a current Ir 18 during reading. The conventional memory cell 10 includes a magnetic tunneling junction 12 and a transistor 14. The magnetic tunneling junction 12 is represented by a resistor. The magnetic tunneling junction 12 is coupled to the drain of the transistor 14. The source of the transistor 14 is coupled to ground. The state of the magnetic tunneling junction 12, and thus the data stored by the conventional memory cell 10 is sensed by detecting the voltage at output 16. The output 16 is coupled to the magnetic tunneling junction 12 of the conventional memory cell 10.

Also depicted in FIG. 1 are the conventional word line 22 and conventional digit line 24. The conventional word line 22 is used to select a row of memory cells during reading. Simultaneous use of the bit line 20 drives a read current through the selected memory cell 10. During writing, the conventional digit line 24 and the bit line 20 carry the current used to write data to the selected memory cell 10.

FIG. 2 depicts a conventional memory array 30 using the conventional memory cell 10. The conventional array 30 is shown as including four conventional memory cells 10. The memory cells 10 are coupled to reading/writing column selection 32 via bit lines 34 and 36 and to row selection 50 via conventional word lines 52 and 54. The bit lines are coupled to the magnetic tunneling junctions 12, while the conventional word lines 52 and 54 are coupled to the gates of the transistors 14. Also depicted are conventional digit lines 44 and 46 which carry current that applies a field to the appropriate conventional memory cells 10 during writing. The reading/writing column selection 32 is coupled to write current source 38 and read current source 40 which are coupled to a line 42 coupled to a supply voltage VDD 48. Also shown are current source Iw 38 and Ir 40 used in writing and reading, respectively, to the conventional memory cells 10. Also depicted are transistors 58 and 60 that are controlled using control line 62. FIG. 2 also depicts reference cells 10', reference current 64 and reference signal output 66. The reference current 64 is typically the same as the read current 40.

FIG. 3 depicts a cross-section of the conventional memory array 30. Memory cells 10 having magnetic tunneling junctions 12 and transistors 14 are depicted. The free layer 11, tunneling barrier 13 and pinned layer 15 of each magnetic tunneling junction 12 are shown. The gate 17, drain 19 and source 21 of the transistor 14 and the connection 23 between the between the magnetic tunneling junction 12 and transistor 14 are also explicitly shown. Also depicted are the corresponding conventional word lines 52 and 54, conventional digit lines 44 and 46 and bit line 34.

Referring to FIGS. 1, 2 and 3, in order to write to the conventional memory cell 10, the write current Iw 38 is applied to the bit line 34 or 36 selected by the writing/reading column selection 32. The read current Ir 40 is not applied. Both conventional word lines 52 and 54 are disabled. The transistors 14 in all memory cells are disabled. In addition, one of the conventional digit lines 44 or 46 selected carries a current used to write to the selected conventional memory cell 10. The combination of the current in a conventional digit line 44 or 46 and the current in a bit line 34 or 36 will write to the desired conventional memory cell 10. Depending upon the data written to the conventional memory cell 10, the magnetic tunneling junction will have a high resistance or a low resistance.

When reading from a conventional cell 10 in the conventional memory array 30, the write current Iw 38 is disabled and the transistors 58 and 60 are turned off by controlling the control signal through the control line 62. The read current Ir 40 is applied instead. In addition, the reference current 64 is applied to reference cells 10'. The memory cell 10 selected to be read is determined by the row selection and column selection 32. The transistors 14 in the selected cell are on. The output voltage is read at the output line 56 and compared to the reference signal at the reference signal output line 66.

Although the conventional memory array 30 and the conventional memory cells 10 function, one of ordinary skill in the art will readily recognize that the conventional memory array 30 is limited in density and relatively difficult to fabricate. The conventional word lines 22, 52 and 54 are electrically isolated from the conventional digit lines 24, 44 and 46. Moreover, as depicted in FIG. 3, the conventional word lines 22, 52 and 54 are typically under the digit lines 24, 44 and 46, respectively. Consequently, the conventional memory array 30 requires more space vertically. The conventional memory array 30 thus has a greater dimension laterally for a given number of cells. Furthermore, additional processing is required to fabricate and adequately insulate the conventional word lines 22, 52 and 56 as well as the conventional digit lines 24, 44, and 46. Because of the difficulty in processing and greater space requirements, increasing the density of the conventional memory array 30 and decreasing the minimum width and feature size of the conventional memory array 30 are difficult.

Accordingly, what is needed is a system and method for providing a magnetic memory cell allowing for an increased density. The present invention addresses such a need.

SUMMARY OF THE INVENTION

The present invention provides a method and system for providing and using a magnetic memory including magnetic memory cells. The method and system include providing a magnetic tunneling junction including a first ferromagnetic layer, a second ferromagnetic layer and an insulating layer between the first ferromagnetic layer and the second ferromagnetic layer. The magnetic memory cell is coupled to a merged word line and a bit line. The merged word line selects the magnetic memory cell during a reading and carries a write current for the magnetic memory cell during writing. The bit line provides current to the magnetic memory cell during the reading and the writing. The currents provided by the bit line and the merged word line during writing allow data to be written to the magnetic memory cell.

According to the system and method disclosed herein, the present invention provides a magnetic memory capable of having higher density and that is simpler to fabricate.

DETAILED DESCRIPTION OF THE INVENTION

The present invention relates to an improvement in magnetic memories. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiment shown, but is to be accorded the widest scope consistent with the principles and features described herein.

The present invention provides a method and system for providing and using a magnetic memory including magnetic memory cells. The method and system include providing a magnetic tunneling junction including a first ferromagnetic layer, a second ferromagnetic layer and an insulating layer between the first ferromagnetic layer and the second ferromagnetic layer. The magnetic memory cell is coupled to a merged word line and a bit line. The merged word line selects the magnetic memory cell during a reading and carries a write current for the magnetic memory cell during writing. The bit line provides current to the magnetic memory cell during the reading and the writing. The currents provided by the bit line and the merged word line during writing allow data to be written to the magnetic memory cell.

The present invention will be described in terms of a particular memory array having certain magnetic memory cells. However, one of ordinary skill in the art will readily recognize that this method and system will operate effectively for other memory arrays having other and/or additional components and other and/or additional magnetic memory cells not inconsistent with the present invention.

Figure 4:
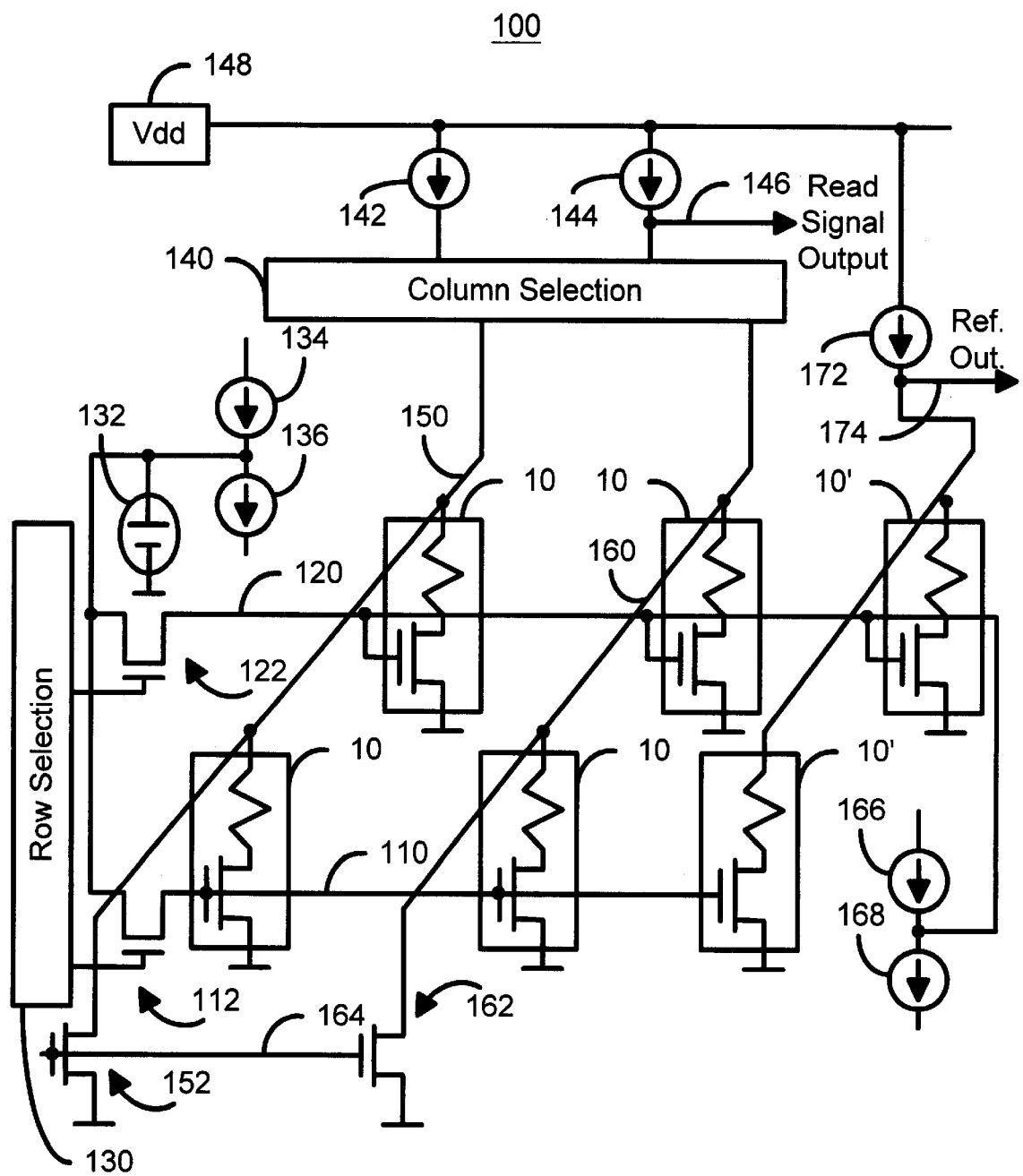
FIG. 4 is a diagram of one embodiment of a memory array using one embodiment of merged word and digit lines in accordance with the present invention.

To more particularly illustrate the method and system in accordance with the present invention, refer now to FIG. 4, depicting one embodiment of a magnetic memory array 100 in accordance with the present invention. The magnetic memory array 100 is depicted as including conventional magnetic memory cells 10 and 10'. However, another type of magnetic memory cells can be used. In such a case, the magnetic memory array 100 still functions essentially as described below.

In addition to the memory cells 10 and reference cells 10', the magnetic memory array 100 includes bit lines 150 and 160, merged word lines 110 and 120, row selection 130 and column selection 140. A write current 142 and read current 144 are provided using the supply voltage 148 and are used for reading from and writing to the magnetic memory 100. The read signal is output via line 146. A reference current 172 is provided to the reference cells 10' using reference line 170. The reference signal is output via reference output 174. Row selection is performed using transistors 112 and 122 coupled to merged word lines 110 and 120, respectively. Similarly, bit lines 150 and 160 are coupled to transistors 152 and 162, respectively. The transistors 152 and 162 are turned on or off using line 164. An additional current can be provided to the merged word lines 110 and 120 using current sources 134, 136, 166 and 168. Also shown is voltage source 132.

Figure 1:
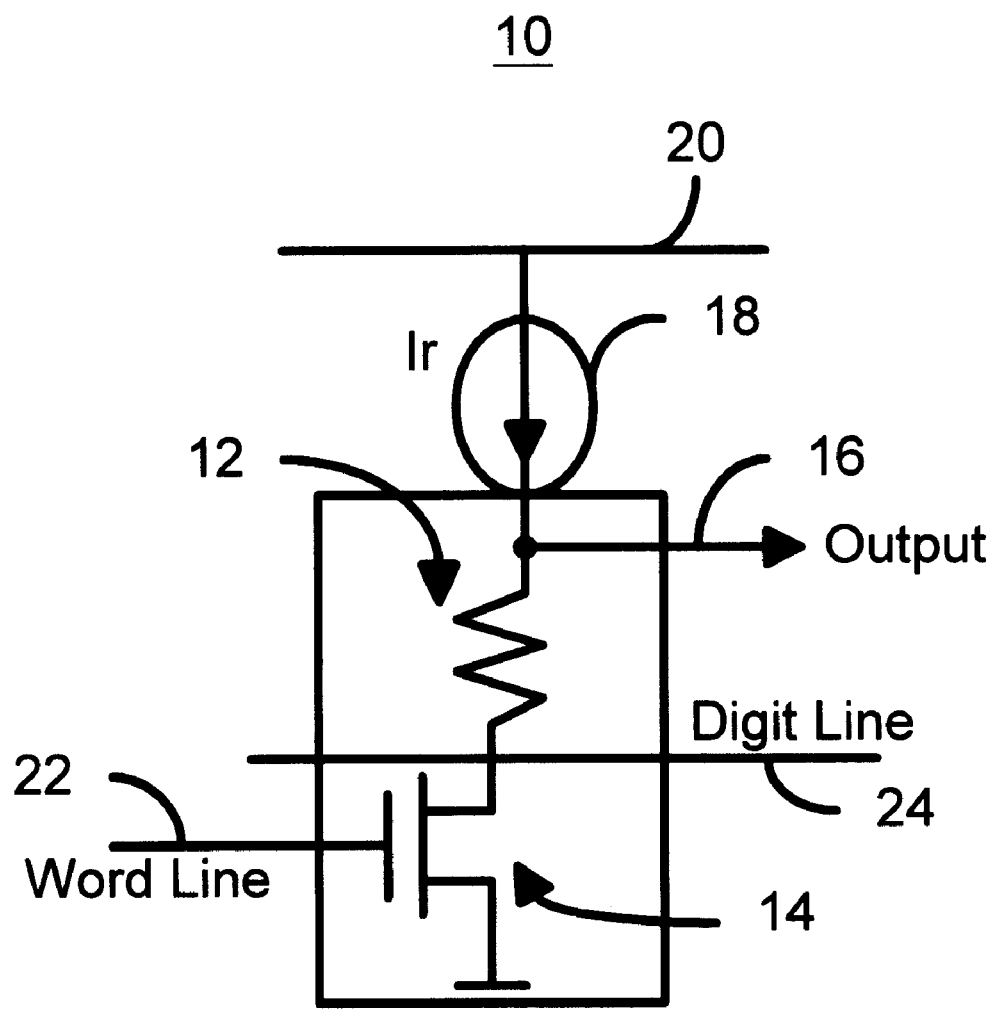
FIG. 1 is a diagram of a conventional magnetic memory cell.
Figure 2:
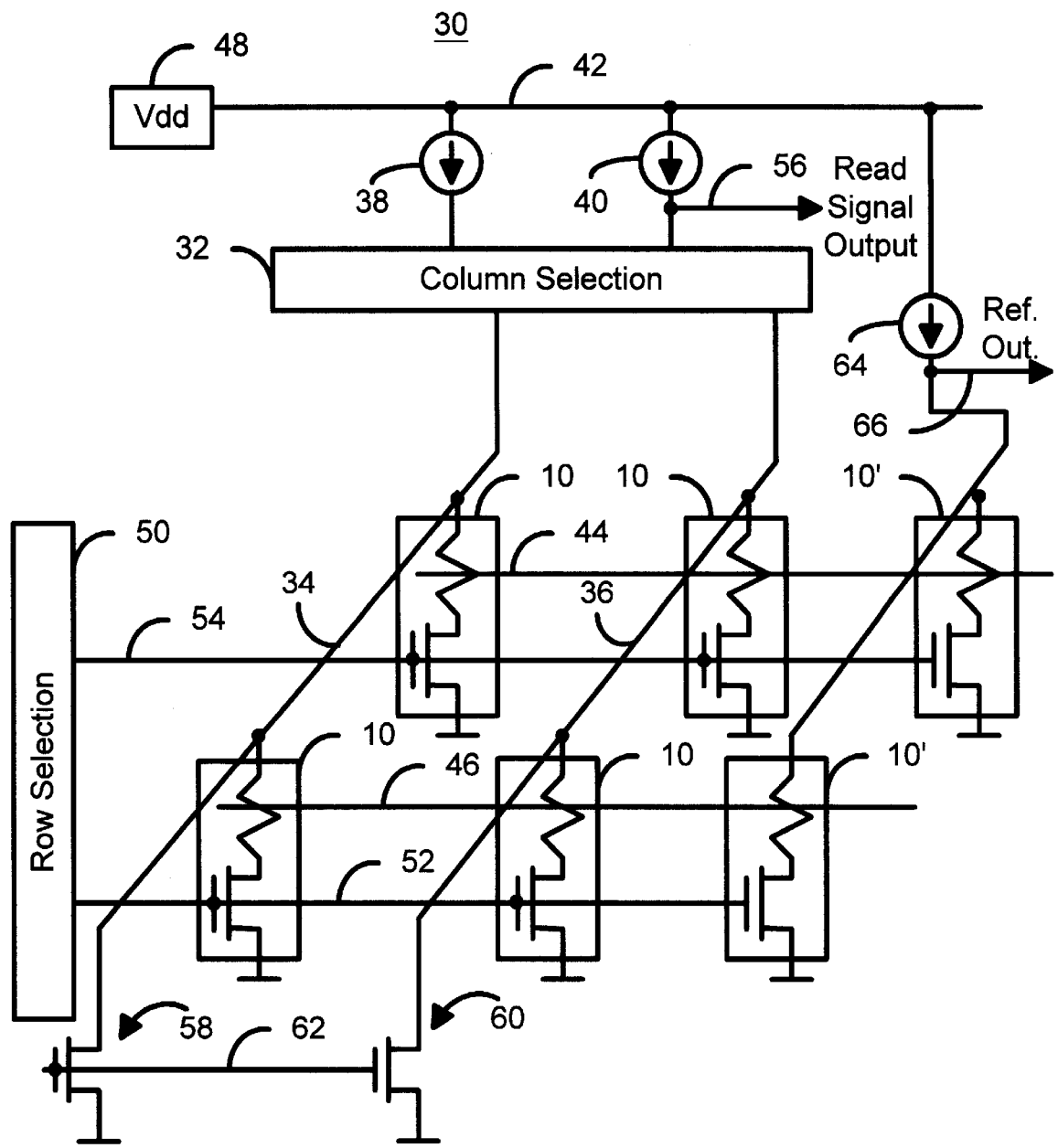
FIG. 2 is a diagram of a conventional memory array that utilizes conventional word lines and conventional bit lines.
Figure 3:
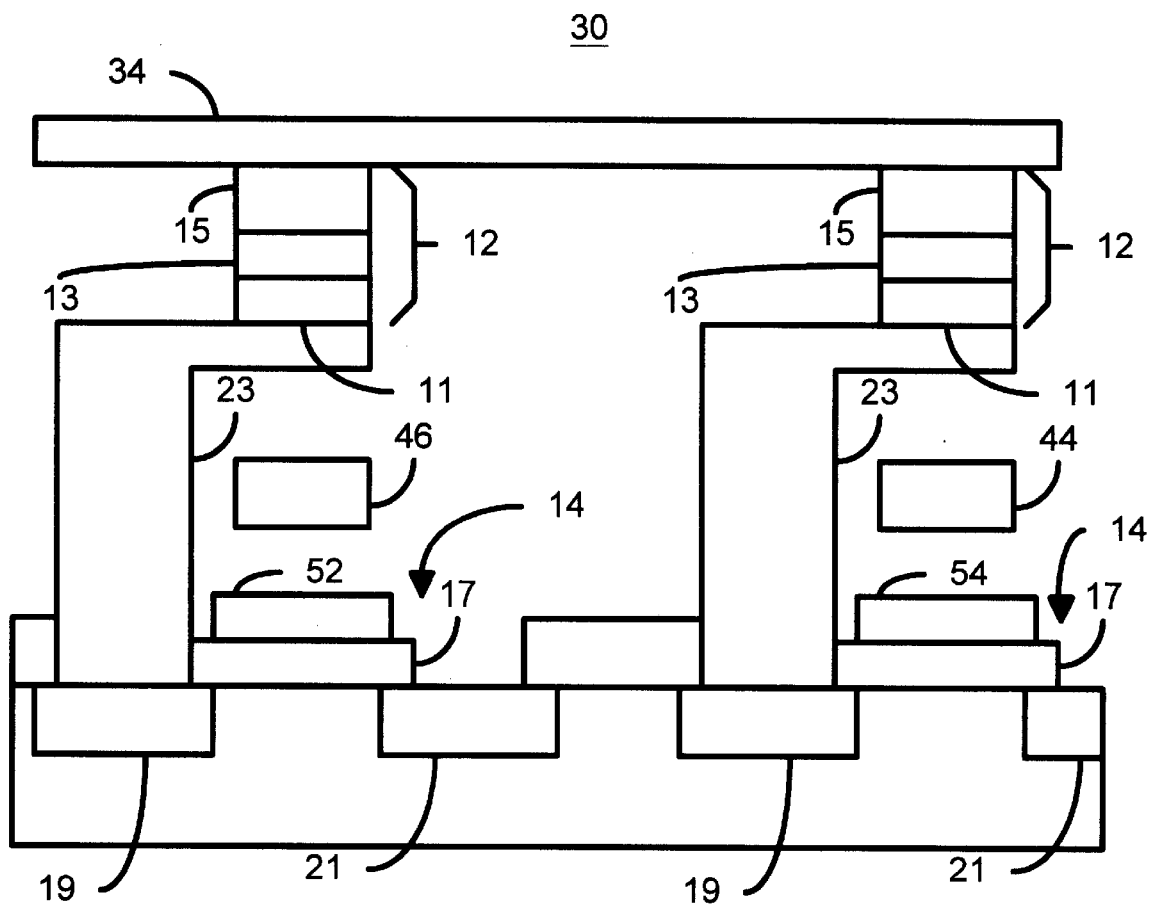
FIG. 3 is a diagram of cross-section of a column of memory cells in the conventional memory array using the conventional word and bit lines.

The merged word lines 110 and 120 are used both for selecting cells 10 in rows of the memory array 100 during reading and for providing a current during writing. Thus, the merged word lines 110 and 120 can be considered to be merged because the merged word lines 110 and 120 perform function associated with both the conventional word lines 52 and 54 and the conventional digit lines 44 and 46 of the conventional memory array 30 depicted in FIG. 2. Referring back to FIG. 4, single, merged word lines 110 and 120 are thus used. The merged word lines 110 and 120 are preferably thicker than the conventional word lines 52 and 54 shown in FIG. 2 because the merged word lines 110 and 120 are capable of carrying a greater current during writing. In addition, the size of the merged word lines 110 and 120 should scale with the size of the memory cells 10 in the memory array 100. For example, for a critical dimension of approximately 0.13 $\mu$m, the width of the merged word lines 110 and 120 is preferably 0.26 $\mu$m and the thickness of the merged word lines is preferably 0.13 $\mu$m.

Figure 5:
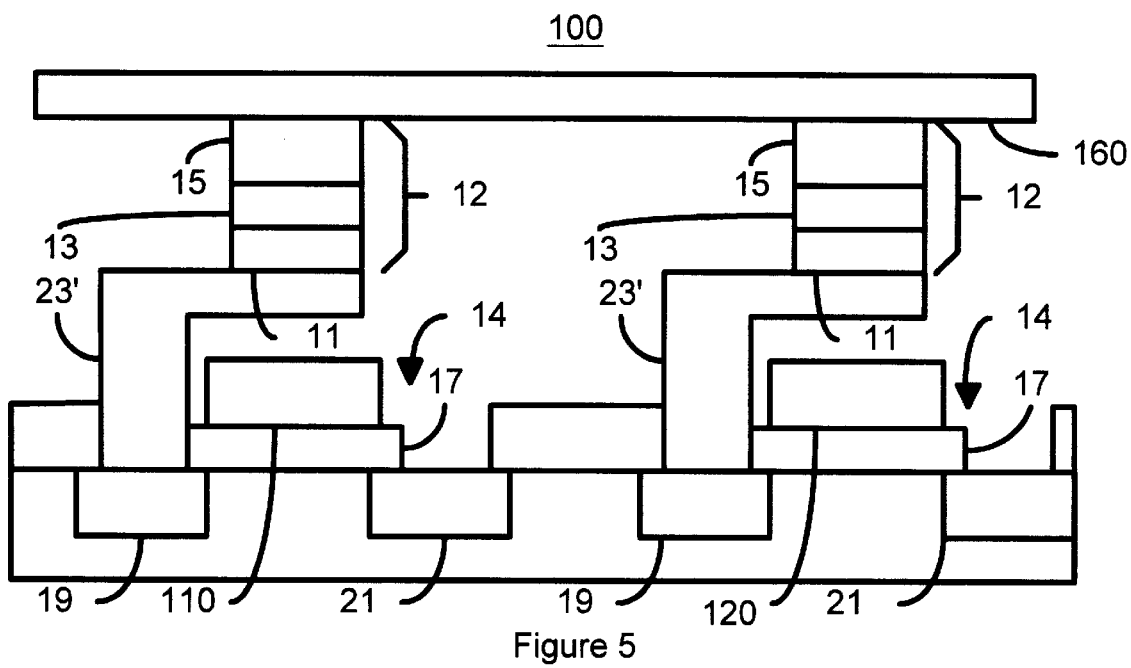
FIG. 5 is a diagram of cross-section of a column of memory cells one embodiment of a memory array using one embodiment of merged word and digit lines in accordance with the present invention.

FIG. 5 is a diagram of cross-section of a column of memory cells one embodiment of the memory array 100 using one embodiment of merged word lines 110 and 120 that are merged word and digit lines in accordance with the present invention. The pinned layers 15, tunneling barriers 13 and free layers 11 of the magnetic tunneling junction 12 as well as the source 21, drain 19 and gate 17 of the transistor 14 are explicitly shown. The connection 23' between the magnetic tunneling junction 12 and transistor 14 is also shown. Thus, in one embodiment of the memory array 100 the memory cell 10 used can be a conventional memory cell. The merged word lines 110 and 120 are preferably connected to the gates 17, but insulated from direct contact with the connection 23 and the magnetic tunneling junction 12. The merged word lines 110 and 120 are preferably fabricated between the magnetic tunneling junction 12 and the gates 17 of the transistors 14.

Figure 6:
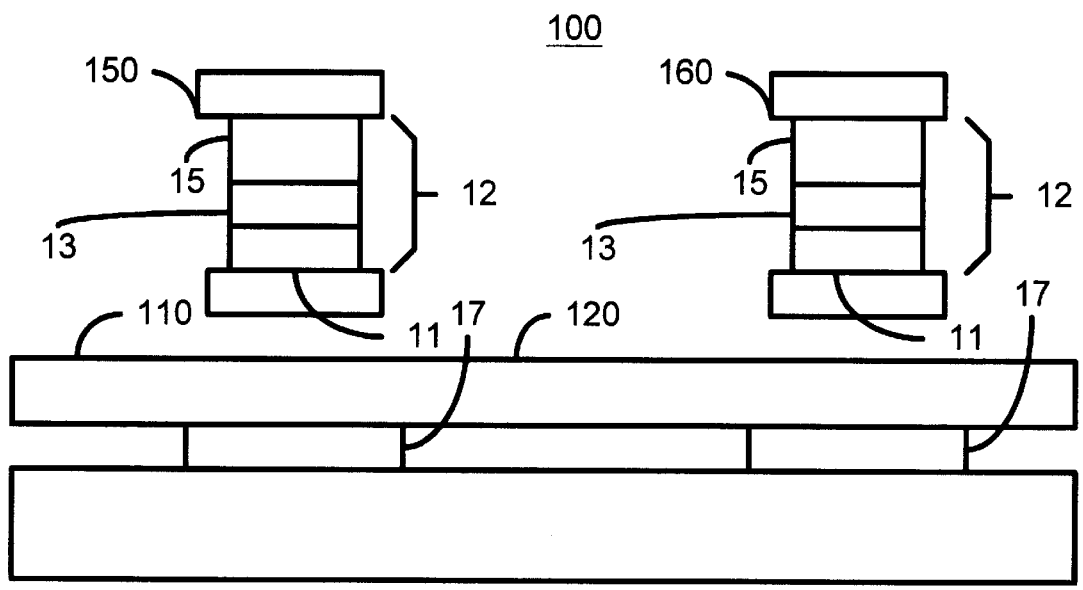
FIG. 6 is a diagram of cross-section of a row of memory cells one embodiment of a memory array using one embodiment of merged word and digit lines in accordance with the present invention.

FIG. 6 is a diagram of cross-section of a row of memory cells 10 one embodiment 100 of a memory array 100 using one embodiment of merged word lines 110 and 120 that are merged word and digit lines in accordance with the present invention. As can be seen in FIG. 6, the merged word line 120 resides between the magnetic tunneling junctions 12 and the gates 17 of the transistors 14, which also includes source/drain regions 19/21.

Referring to FIGS. 4, 5 and 6, the merged word lines 110 and 120 serve both as word lines during reading to select the row of memory cells 10 being read and as digit lines during writing to provide a write current to the selected row of memory cells. In operation, the current sources 142, 134, 136, 166 and 168, which provide write currents, are disabled. The voltage source 132 and read current 144 are enabled. The row selection 130 selects a row for reading by providing a voltage to the gate of the transistor 122 or 112. Thus, the voltage Vc is applied to the selected merged word line 110 or 120. Thus, the transistors 14 in the row coupled to merged word line 110 or 120 are enabled. The column selection 140 selects a bit line 150 or 160. The read current 144 is thus applied to the memory cells 10 in the selected column via bit line 150 or 160. Thus, the column and row are selected to select a particular memory cell 10. The read current flows through the selected bit line 150 or 160 to ground. The resulting voltage corresponds to the read signal provided via the output line 146. In addition, a read current 172 is provided to the reference cells 10' via line 170 and the reference signal output via reference line 174. The read signal is compared to the reference signal to determine the state of the selected memory cell 10.

During writing, the voltage source 132 and read current 144 are disabled. Write current source 142 and either current sources 134 and 168 or current sources 136 and 166 are enabled. The current sources 34 and 168 or 136 and 166 enabled depend upon the data being written. The transistors 14 are not turned on. Column selection 140 selects a column by selecting a bit line 150 or 160. The write current 142 is thus applied to the selected bit line 150 or 160. The row selection 130 selects a merged word line 110 or 120 to enable using the transistor 112 or 122, respectively. Depending upon the data to be written, current from the current sources 134 and 168 or current from the current sources 136 and 166 is provided to the merged word line 110 or 120. Current from the current sources 134 and 168 or from the current sources 136 and 166 will cause the magnetization of the free layer 11 to be parallel (low resistance state) or antiparallel (high resistance state) to the magnetization of the pinned layer 15.

Because the merged word lines 110 and 120 are used both for selecting a row during reading and for applying a current during writing, the merged word lines 110 and 120 eliminate the need for an additional digit line. As a result, the height of the memory array is reduced. Furthermore, elimination of the digit line simplifies processing. Moreover, as can be seen in FIG. 5, the connection 23' between the magnetic tunneling junction 12 and the transistor 14 can be made smaller in width. This decrease in size can be achieved substantially without degrading the performance of the magnetic memory 100. For example, it is expected that the smaller width of the connection 23' made possible by the use of merged word lines 110 and 120 will not substantially impact connection reliability, connection resistance or other connection properties. The decrease in the lateral dimension of the connection 23' and the elimination of the digit line through the use of the merged word lines 110 and 120 thus allow a higher density of magnetic memory cells 10 to be fabricated in the memory array 100. This increase in density can be achieved while simplifying the fabrication of the memory array 100 through the elimination of a component, the digit line.

A method and system has been disclosed for a magnetic memory cell, a magnetic memory array and a method for utilizing the memory cell and array. Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A magnetic memory cell comprising:
   a magnetic tunneling junction including a first ferromagnetic layer, a second ferromagnetic layer and an insulating layer between the first ferromagnetic layer and the second ferromagnetic layer;
   wherein the magnetic memory cell is coupled to a merged word line, the merged word line being configured for selecting the magnetic memory cell during a reading and for carrying a write current for the magnetic memory cell during a writing; and
   wherein the magnetic memory cell is coupled to a bit line for providing current to the magnetic memory cell during the reading and the writing.

2. The magnetic memory cell of claim 1 further comprising:
   a transistor coupled to the magnetic tunneling junction, the transistor including a source, a drain and a gate.

3. The magnetic memory cell of claim 2 wherein the merged word line is coupled to the gate of the transistor.

4. The magnetic memory cell of claim 1 wherein the bit line is coupled to the magnetic tunneling junction.

5. A magnetic memory comprising:
   a plurality of memory cells arranged in an array including a plurality of rows and a plurality of columns, each of the plurality of memory cells including at least a magnetic tunneling junction;
   a plurality of merged word lines coupled to the plurality of rows, the plurality of merged word lines for selecting between the plurality of rows during a reading and for carrying a write current to a selected row of the plurality of rows during writing;
   a plurality of bit lines coupled to the plurality of columns, the plurality of bit lines for selecting between the plurality of columns during the reading and the writing.

6. The magnetic memory of claim 5 wherein each of the plurality of memory cells includes a transistor coupled to the magnetic tunneling junction, the transistor including a source, a drain and a gate.

7. The magnetic memory of claim 6 wherein the merged word line is coupled to the gate of the transistor.

8. The magnetic memory of claim 5 wherein the bit line is coupled to the magnetic tunneling junction.

9. A method for utilizing a magnetic memory comprising the steps of:
   (a) in a write mode, writing to a first portion of a plurality of memory cells by providing a first current in a merged word line of a plurality of merged word lines and a second current in a bit line of a plurality of bit lines, the plurality of memory cells arranged in an array including a plurality of rows and a plurality of columns, each of the plurality of memory cells including a magnetic tunneling junction;
   (b) in a read mode, reading from a second portion of the plurality of memory cells by providing a read current in the bit line of the plurality of bit lines and by selecting a row using the merged word line of the plurality of merged word lines.

10. The method of claim 9 wherein each of the plurality of memory cells includes a transistor coupled to the magnetic tunneling junction, the transistor including a source, a drain and a gate.

11. The method of claim 10 wherein the merged word line is coupled to the gate of the transistor.

12. The method of claim 9 wherein the bit line is coupled to the magnetic tunneling junction.

* * * * *